(12) United States Patent
Kitazume (10) Patent No.: US 12,177,990 B2
(45) Date of Patent: Dec. 24, 2024

(54) ELECTRONIC COMPONENT MODULE, AND METHOD OF MANUFACTURING ELECTRONIC COMPONENT MODULE

(71) Applicant: Murata Manufacturing Co., Ltd., Nagaokakyo (JP)

(72) Inventor: Takahiro Kitazume, Nagaokakyo (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 296 days.

(21) Appl. No.: 17/653,664

(22) Filed: Mar. 7, 2022

(65) Prior Publication Data

US 2022/0192032 A1   Jun. 16, 2022

Related U.S. Application Data

(63) Continuation of application No. PCT/JP2020/039086, filed on Oct. 16, 2020.

(30) Foreign Application Priority Data

Oct. 30, 2019   (JP) .................................. 2019-196853

(51) Int. Cl.
| | | |
|---|---|---|
| *H05K 3/34* | (2006.01) | |
| *H01L 21/60* | (2006.01) | |
| *H01L 23/00* | (2006.01) | |
| *H01L 23/12* | (2006.01) | |
| *H05K 3/36* | (2006.01) | |

(52) U.S. Cl.
CPC ........... *H05K 3/3478* (2013.01); *H01L 21/60* (2021.08); *H01L 23/12* (2013.01); *H01L 24/13* (2013.01); *H05K 3/363* (2013.01); *H01L 2021/60097* (2013.01)

(58) Field of Classification Search
CPC .................................................... H05K 3/3478
See application file for complete search history.

(56) References Cited

U.S. PATENT DOCUMENTS

| | | | | |
|---|---|---|---|---|
| 10,256,173 | B2 * | 4/2019 | Wu | ...................... H01L 23/3128 |
| 2004/0108367 | A1 * | 6/2004 | Farooq | ..................... H01L 24/16 |
| | | | | 257/E23.021 |
| 2005/0121761 | A1 * | 6/2005 | Maeda | ..................... H01L 24/81 |
| | | | | 257/E21.705 |
| 2006/0022320 | A1 | 2/2006 | Nakanishi et al. | |

(Continued)

FOREIGN PATENT DOCUMENTS

| | | |
|---|---|---|
| JP | S53-142663 A | 12/1978 |
| JP | H08-279681 A | 10/1996 |

(Continued)

OTHER PUBLICATIONS

International Search Report for PCT/JP2020/039086 dated Dec. 28, 2020.

*Primary Examiner* — William A Harriston
(74) *Attorney, Agent, or Firm* — Pearne & Gordon LLP (57) ABSTRACT

An electronic component module includes a substrate including a first main surface and a second main surface, and using a side near the second main surface as a mounting side, an external terminal by a solder ball made of first solder, on the second main surface, and a first electronic component mounted by using second solder, on the first main surface, and a melting point of the first solder is higher than a melting point of the second solder.

10 Claims, 7 Drawing Sheets

(56) References Cited

U.S. PATENT DOCUMENTS

2007/0240900 A1* 10/2007 Yokomaku ............. H05K 1/141
  174/262
2018/0096949 A1   4/2018 Chen et al.
2020/0118913 A1* 4/2020 Matsukawa ........... H01L 23/552

FOREIGN PATENT DOCUMENTS

| JP | 2001-244287 A | 9/2001 |
| JP | 2004-207494 A | 7/2004 |
| JP | 2006-041401 A | 2/2006 |
| WO | 2018/235715 A1 | 12/2018 |

\* cited by examiner

ELECTRONIC COMPONENT MODULE, AND METHOD OF MANUFACTURING ELECTRONIC COMPONENT MODULE

CROSS REFERENCE TO RELATED APPLICATION

This is a continuation of International Application No. PCT/JP2020/039086 filed on Oct. 16, 2020 which claims priority from Japanese Patent Application No. 2019-196853 filed on Oct. 30, 2019. The contents of these applications are incorporated herein by reference in their entireties.

BACKGROUND OF THE DISCLOSURE

Field of the Disclosure

The present disclosure relates to an electronic component module that includes a mountable electronic component and a substrate and that provides an external connection terminal with a solder ball.

Description of the Related Art

Patent Literature 1 discloses a package device including a substrate, an electronic component, and an external connection terminal. The electronic component is mounted on a front surface and back surface of the substrate. The external connection terminal is provided on the back surface of the substrate, and is made of a solder ball.

Patent Literature 1: U.S. Unexamined Patent Application Publication No. 2018/0096949

BRIEF SUMMARY OF THE DISCLOSURE

However, in the structure as disclosed in Patent Literature 1, when a solder ball is first formed and then an electronic component is mounted, the solder ball may be deformed due to heat during mounting of the electronic component.

When the solder ball deforms, a shape of an external connection terminal may be deformed, which reduces mountability and bondability to other circuit boards.

In view of the foregoing, exemplary embodiments of the present disclosure provide an electronic component module including a substrate, an electronic component, and an external connection terminal using a solder ball, the electronic component module being capable of significantly reducing or preventing a reduction in mountability and bondability to other circuit boards.

An electronic component module according to an exemplary embodiment of the present disclosure includes a substrate including a first main surface and a second main surface and using a side near the second main surface as a mounting side, an external terminal by a solder ball made of first solder on the second main surface, and a first electronic component mounted on the first main surface by using second solder. A melting point of the first solder is higher than a melting point of the second solder.

With this configuration, after the solder ball is formed on the substrate, even when a first electronic component is mounted, the solder ball is able to be significantly reduced or prevented from being remelt. Therefore, deformation of the solder ball is significantly reduced or prevented.

According to the present disclosure, a reduction in the mountability and bondability to other circuit boards is able to be significantly reduced or prevented.

DETAILED DESCRIPTION OF THE DISCLOSURE

First Exemplary Embodiment

Figure 1:
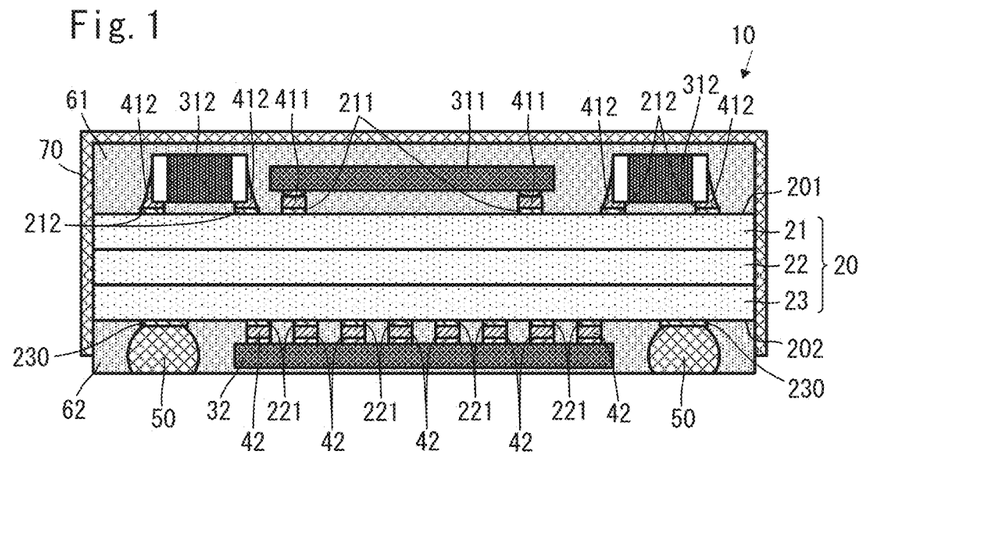
FIG. 1 is a side cross-sectional view showing a configuration of an electronic component module according to a first exemplary embodiment of the present disclosure.

An electronic component module according to a first exemplary embodiment of the present disclosure will be described with reference to drawings. FIG. 1 is a side cross-sectional view showing a configuration of the electronic component module according to the first exemplary embodiment of the present disclosure.

As shown in FIG. 1, an electronic component module 10 includes a substrate 20, an electronic component 311, an electronic component 312, an electronic component 32, an external terminal 50, an insulating resin layer 61, an insulating resin layer 62, and a shield film 70. The electronic component 311 and the electronic component 312 each correspond to a "first electronic component" of the present disclosure, and the electronic component 32 corresponds to a "second electronic component" of the present disclosure.

The substrate 20 has an insulating main body. The substrate 20, as shown in FIG. 1, for example, includes a plurality of dielectric layers stacked on each other. Although not shown, the substrate 20 includes a conductor pattern to implement the electronic component module 10.

The substrate 20 is a rectangular or substantially rectangular flat plate in a plan view, for example, and includes a first main surface 201 and a second main surface 202 that face each other. It is to be noted that the substrate 20 is a ceramic multilayer substrate. However, the substrate 20 may be a multilayer resin substrate.

A land conductor 211 and a land conductor 212 are provided on the first main surface 201 of the substrate 20. The arrangement of land conductors 211 corresponds to the arrangement of terminals of the electronic component 311. The arrangement of land conductors 212 corresponds to the arrangement of terminals of the electronic component 312.

A land conductor 221 and a land conductor 230 are provided on the second main surface 202 of the substrate 20. The arrangement of land conductors 221 corresponds to the arrangement of terminals of the electronic component 32.

The arrangement of land conductors 230 corresponds to the arrangement of external terminals 50 being the electronic component module 10.

The electronic component 311 is mounted to the land conductor 211 by using solder 411. The electronic component 312 is mounted to the land conductor 212 by using solder 412.

The electronic component 32 is mounted to the land conductor 221 by using solder 42.

The external terminal 50 is implemented by a solder ball provided on the land conductor 230.

The insulating resin layer 61 covers a side of the first main surface 201 of the substrate 20. The insulating resin layer 61 also covers the electronic component 311 and the electronic component 312. The insulating resin layer 62 covers a side of the second main surface 202 of the substrate 20. The insulating resin layer 62 also covers the electronic component 32 and the external terminal 50. However, one surface of the external terminal 50 opposite to the other surface bonded to the land conductor 230 is exposed from the insulating resin layer 62. These insulating resin layer 61 and insulating resin layer are able to protect the electronic component 311, the electronic component 312, the electronic component 32, and the conductor pattern provided on the first main surface 201 and the second main surface 202 of the substrate 20, from the external environment.

The shield film 70 is an electrically conductive film. The shield film 70 covers the entire outer surface of the insulating resin layer 61, the entire side surfaces of the substrate 20, and at least a portion of the side surfaces of the insulating resin layer 62. In such a manner, the shield film is able to significantly reduce or prevent unnecessary coupling and interference between the electronic component 311, the electronic component 312, the electronic component 32, and an electrical configuration provided in the substrate 20, and the external environment.

In addition, in such a configuration, the solder 411, the solder 412, and the solder 42 are formed by second solder. On the other hand, the solder ball configuring the external terminal 50 is made of first solder.

In the present exemplary embodiment, the melting point of the first solder is higher than the melting point of the second solder. In other words, the melting point of the second solder is lower than the melting point of the first solder. For example, in a case in which the melting point of the second solder is about 220° C., the melting point of the first solder is from about 240° C. to about 280° C. In other words, the second solder is a common solder and the first solder is a high melting point solder.

In order to implement the above, Sn/Ag/Cu-based solder is used for the second solder. In contrast, Sn/Sb-based solder or Sn/Cu-based solder is used for the first solder. Alternatively, the first solder may be Sn/Ag/Cu-based solder with a high ratio of Ag and Cu to Sn.

Such a configuration is able to significantly reduce or prevent the external terminal 50 from melting due to the heat during reflow for the solder 411, the solder 412, and the solder when the electronic component 311, the electronic component 312, and the electronic component 32 are mounted by the solder 411, the solder 412, and the solder 42 after the external terminal 50 using a solder ball is formed. As a result, deformation of the external terminal 50 is able to be significantly reduced or prevented, and a reduction in the mountability and bondability of the electronic component module 10 to other circuit boards is able to be significantly reduced or prevented.

Figure 2:
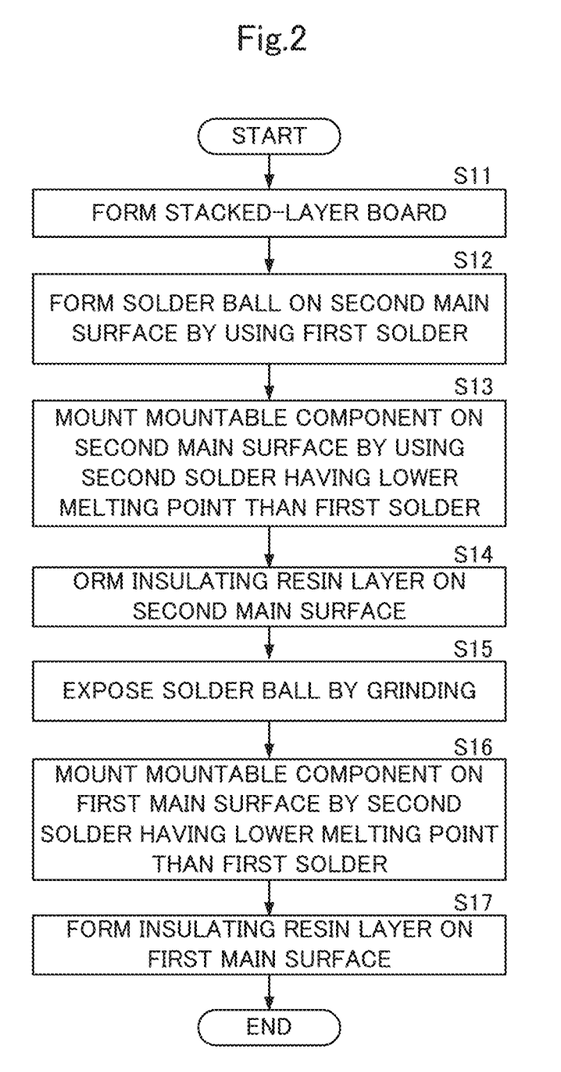
FIG. 2 is a flow chart showing a method of manufacturing the electronic component module according to the first exemplary embodiment.

The electronic component module 10 of such a configuration is able to be manufactured as follows. FIG. 2 is a flow chart showing a method of manufacturing the electronic component module according to the first exemplary embodiment. FIG. 3A, FIG. 3B, FIG. 3C, FIG. 3D, FIG. 4A, and FIG. 4B are side cross-sectional views showing a state of each step in the method of manufacturing an electronic component module.

Figure 3A:
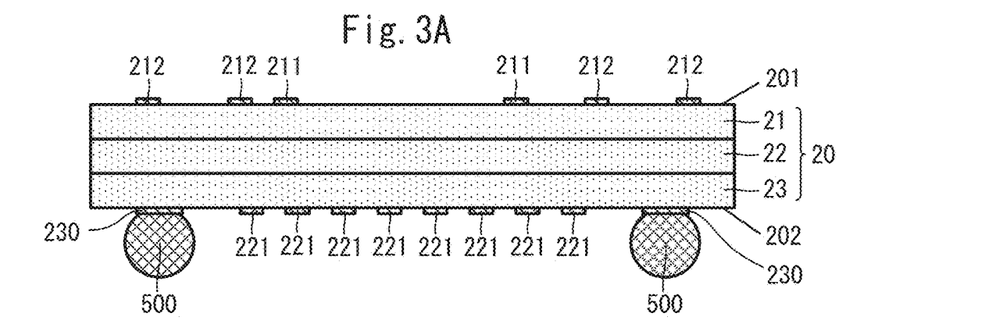
FIG. 3A, FIG. 3B, FIG. 3C, and FIG. 3D are side cross-sectional views showing a state of each step in the method of manufacturing an electronic component module.

First, a plurality of dielectric layers are stacked and fired to form a substrate 20 made of a stacked-layer board (S11). Next, as shown in FIG. 3A, a solder ball 500 is formed on the land conductor 230 on the second main surface 202 of the substrate 20 by using the first solder (S12).

Figure 3B:
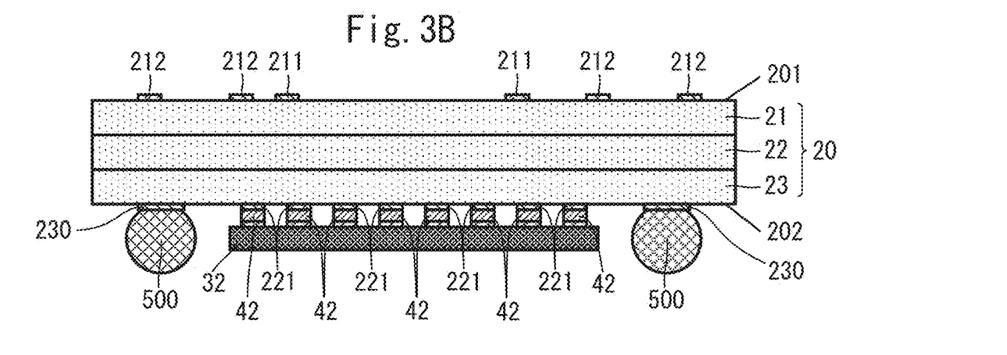

Subsequently, as shown in FIG. 3B, an electronic component 32 is mounted to the land conductor 221 of the second main surface 202 of the substrate 20, by using solder 42 (S13). The solder 42 is solder (the second solder) having a lower melting point than the solder ball 500. Then, a temperature of reflow during mounting using the solder 42 is set to a temperature at which the solder 42 melts and the solder ball 500 does not melt. Accordingly, melting and deformation of the solder ball 500 is able to be significantly reduced or prevented while the electronic component 32 is bonded to the substrate 20.

Figure 3C:
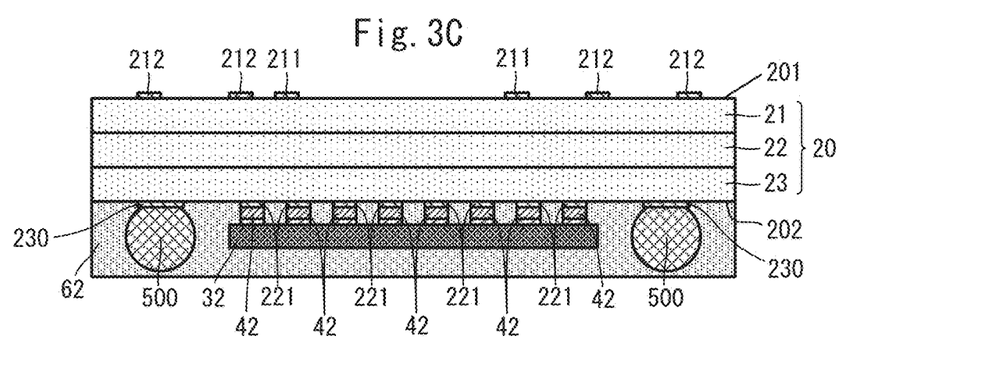

Subsequently, as shown in FIG. 3C, an insulating resin is applied to the entire second main surface 202 of the substrate 20, the entire surface of the electronic component 32, and the solder ball 500. The insulating resin is then cured to form an insulating resin layer 62 (S14). The insulating resin layer 62 covers the entire second main surface 202 of the substrate 20 and also covers the entire surface of the electronic component 32 and the solder ball 500.

Figure 3D:
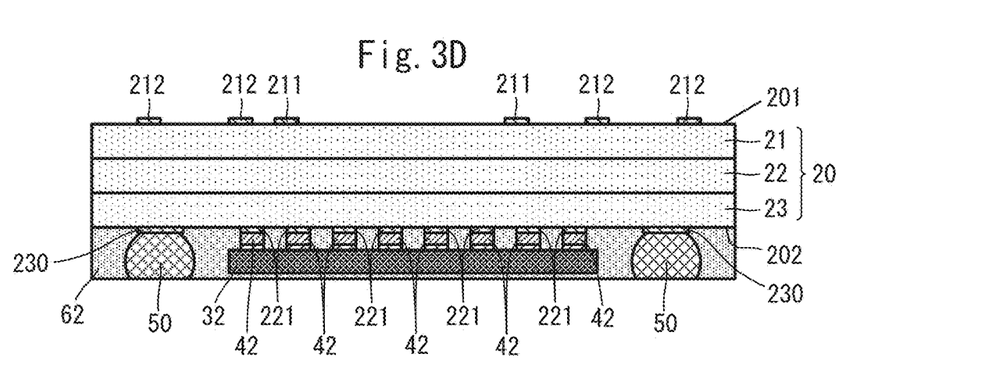

Subsequently, as shown in FIG. 3D, the insulating resin layer 61 and the insulating resin layer 62 are ground. At this time, the solder ball 500 is partially removed, and the insulating resin layer 62 is ground until being exposed to the outside (S15). As a result, an external terminal 50 to be exposed to the outside is formed.

Figure 4A:
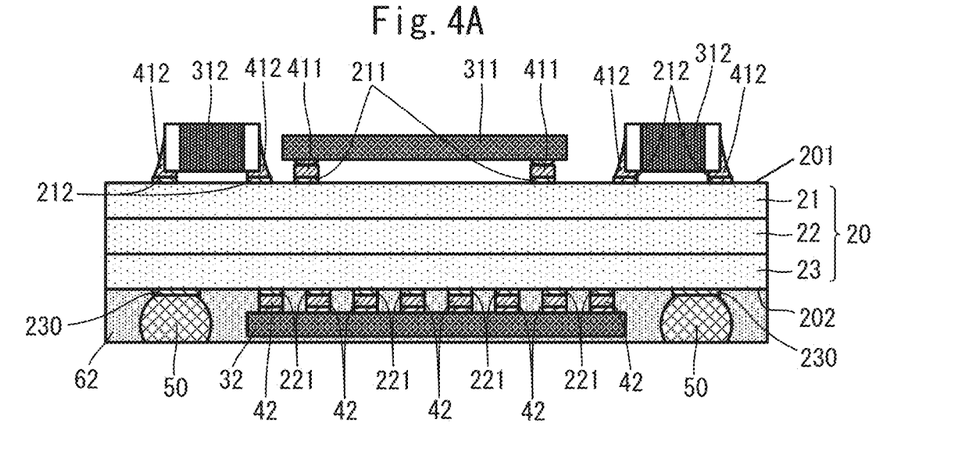
FIG. 4A and FIG. 4B are side cross-sectional views showing a state of each step in the method of manufacturing an electronic component module.

Subsequently, as shown in FIG. 4A, an electronic component 311 and an electronic component 312 are mounted to the land conductor 211 and the land conductor 212 of the first main surface 201 of the substrate 20, by using solder 411 and solder 412 (S16). The solder 411 and the solder 412 are solder (the second solder) having a lower melting point than the solder ball 500. Then, a temperature of reflow during mounting using the solder 411 and the solder 412 is set to a temperature at which the solder 411 and the solder 412 melt and the solder ball 500 does not melt. Accordingly, melting and deformation of the solder ball 500 is able to be significantly reduced or prevented while the electronic component 311 and the electronic component 312 are bonded to the substrate 20.

Figure 4B:
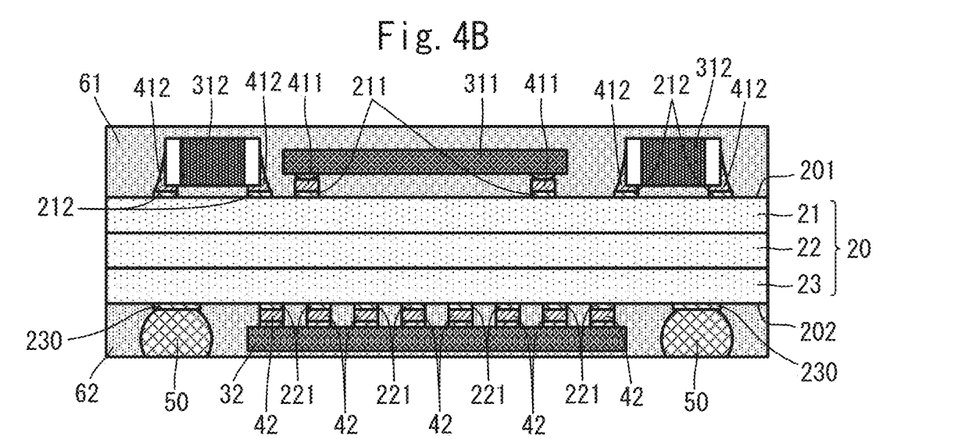

Subsequently, as shown in FIG. 4B, an insulating resin is applied to the entire first main surface 201 of the substrate 20, and the entire surface of the electronic component 311 and electronic component 312. The insulating resin is then cured to form an insulating resin layer 61 (S17). The insulating resin layer 61 covers the entire first main surface 201 of the substrate 20 and also covers the entire surface of the electronic component 311 and the electronic component 312.

It is to be noted that, although not illustrated, a shield film 70 is then formed by, for example, sputtering, to the insulating resin layer 61, the substrate 20, and the insulating resin layer 62.

As described above, the use of a manufacturing method according to the present exemplary embodiment is able to significantly reduce or prevent deformation of the solder ball 500 during reflow even when the solder ball 500 is formed prior to the reflow of an electronic component. As a result, the electronic component module 10 with high bondability and reliability is able to be more reliably manufactured.

Second Exemplary Embodiment

Figure 5:
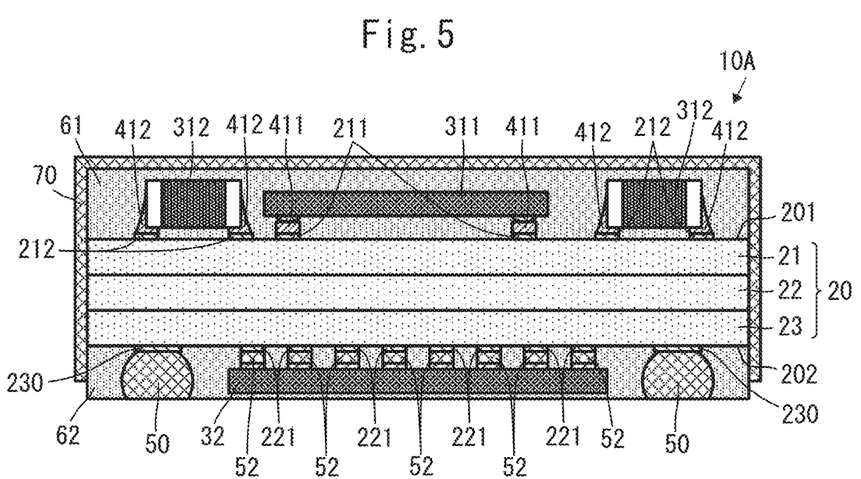
FIG. 5 is a side cross-sectional view showing a configuration of an electronic component module according to a second exemplary embodiment of the present disclosure.

An electronic component module according to a second exemplary embodiment of the present disclosure will be described with reference to drawings. FIG. 5 is a side cross-sectional view showing a configuration of the electronic component module according to the second exemplary embodiment of the present disclosure.

As shown in FIG. 5, the electronic component module 10A according to the second exemplary embodiment is different from the electronic component module 10 according to the first exemplary embodiment in that solder 52 is used. Other configurations of the electronic component module 10A are the same as or similar to the configurations of the electronic component module 10, and a description of the same or similar configuration will be omitted.

An electronic component 32 is bonded (mounted) by solder 52, to the land conductor 221. The solder 52 is made of the same first solder as the external terminal 50.

With such a configuration, the same process is used to mount the electronic component 32 and form a solder ball.

Figure 6:
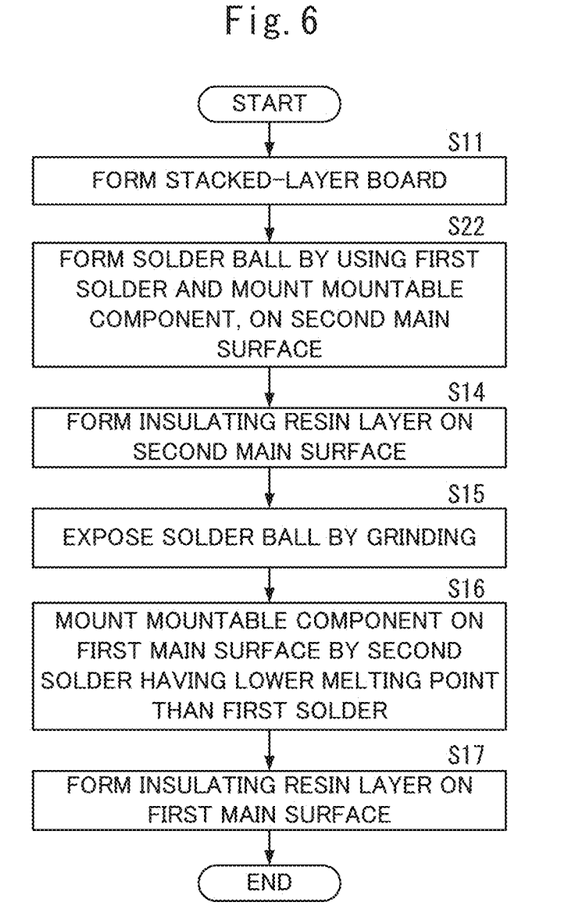
FIG. 6 is a flow chart showing a method of manufacturing the electronic component module according to the second exemplary embodiment.

The electronic component module 10A of such a configuration is able to be manufactured as follows, for example. FIG. 6 is a flow chart showing a method of manufacturing the electronic component module according to the second exemplary embodiment.

First, as with the first exemplary embodiment, a plurality of dielectric layers are stacked and fired to form a substrate 20 made of a stacked-layer board (S11).

Next, a solder ball 500 is formed on the land conductor 230 on the second main surface 202 of the substrate 20 by using the first solder. Simultaneously, the electronic component 32 is mounted to the land conductor 221 on the second main surface 202 of the substrate 20 by using the solder 52 made of the first solder (S22).

Subsequent manufacturing method is the same as the method of manufacturing of the electronic component module 10 of the first exemplary embodiment, and a description will be omitted.

With such a configuration and manufacturing method, the electronic component module 10A is able to obtain the same advantageous functions and effects as the electronic component module 10 according to the first exemplary embodiment.

Third Exemplary Embodiment

Figure 7:
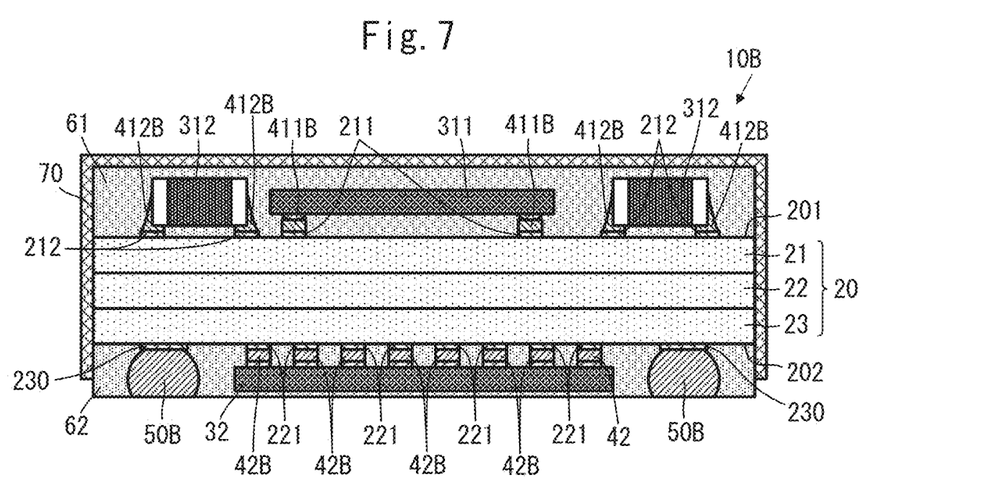
FIG. 7 is a side cross-sectional view showing a configuration of an electronic component module according to a third exemplary embodiment of the present disclosure.

An electronic component module according to a third exemplary embodiment of the present disclosure will be described with reference to the drawings. FIG. 7 is a side cross-sectional view showing a configuration of an electronic component module according to the third exemplary embodiment of the present disclosure.

As shown in FIG. 7, the electronic component module 10B according to the third exemplary embodiment is different from the electronic component module 10 according to the first exemplary embodiment in that solder 411B, solder 412B, solder 42B, and an external terminal 50B are provided. Other configurations of the electronic component module 10B are the same as or similar to the configurations of the electronic component module 10, and a description of the same or similar configuration will be omitted.

In the electronic component module 10B, an electronic component 311 is mounted to the land conductor 211 by using solder 411B. An electronic component 312 is mounted to the land conductor 212 by using solder 412B. An electronic component 32 is mounted by using solder 42B. The solder 411B, the solder 412B, and the solder 42B each correspond to "second solder" of the present disclosure. A solder ball configuring an external terminal 50B is made of first solder.

The melting point of the first solder is higher than the melting point of the second solder. In other words, the melting point of the first solder is lower than the melting point of the second solder. For example, in a case in which the melting point of the first solder is about 220° C., the melting point of the second solder is from about 120° C. to about 210° C. In other words, the first solder is a common solder and the second solder is a low melting point solder.

In order to implement the above, Sn/Ag/Cu-based solder is used for the first solder. In contrast, Sn/In-based solder, Sn/Bi-based solder, Sn/Ag/Bi-based solder, Sn/Ag/Bi/In-based solder, Sn/Ag/Cu/Bi-based solder, or Sn/Ag/Cu/In-based solder is used for the second solder.

Even with such a configuration, the electronic component module 10B is able to obtain the same advantageous functions and effects as the electronic component module 10 and the electronic component module 10A.

It is to be noted that the configuration of each of the above exemplary embodiments is able to be appropriately combined, and advantageous functions and effects according to each combination are able to be obtained.

10, 10A, 10B: electronic component module
20: substrate
32, 311, 312: electronic component
50, 50B: external terminal
61, 62: insulating resin layer
70: shield film
201: first main surface
202: second main surface
211, 212, 221, 230: land conductor
500: solder ball

The invention claimed is:

1. An electronic component module comprising:
   a substrate including a first main surface and a second main surface, the second main surface being a mounting side;
   an external terminal provided by a solder ball comprising a first solder, on the second main surface;
   a first electronic component mounted by using a second solder, on the first main surface, wherein a melting point of the first solder is higher than a melting point of the second solder; and
   a second electronic component mounted by using the first solder, on the second main surface.

2. The electronic component module according to claim 1, wherein:
   the first solder is Sn/Sb-based solder, Sn/Cu-based solder, or Sn/Ag/Cu-based solder; and
   the second solder is Sn/Ag/Cu-based solder.

3. The electronic component module according to claim 2, further comprising an insulating resin covering the first main surface and the second main surface, wherein the external terminal comprising the solder ball includes an exposed end opposite to the second main surface.

4. The electronic component module according to claim 2, further comprising a shield film covering at least a side of the first main surface.

5. The electronic component module according to claim 1, wherein:
- the first solder is Sn/Ag/Cu-based solder; and
- the second solder is Sn/In-based solder, Sn/Bi-based solder, Sn/Ag/Bi-based solder, Sn/Ag/Bi/In-based solder, Sn/Ag/Cu/Bi-based solder, or Sn/Ag/Cu/In-based solder.

6. The electronic component module according to claim 5, further comprising an insulating resin covering the first main surface and the second main surface, wherein the external terminal comprising the solder ball includes an exposed end opposite to the second main surface.

7. The electronic component module according to claim 5, further comprising a shield film covering at least a side of the first main surface.

8. The electronic component module according to claim 1, further comprising an insulating resin covering the first main surface and the second main surface, wherein the external terminal comprising the solder ball includes an exposed end opposite to the second main surface.

9. A method of manufacturing the electronic component module according to claim 8, comprising:
- a step of forming, in the substrate including the first main surface and the second main surface, the solder ball by the first solder, on the second main surface;
- a step of mounting the first electronic component on the first main surface, by using the second solder having a lower melting point than the first solder;
- a step of forming the insulating resin on the second main surface and an entire surface of the solder ball; and
- a step of grinding the insulating resin on the second main surface and exposing the solder ball.

10. The electronic component module according to claim 1, further comprising a shield film covering at least a side of the first main surface.

* * * * *